US006224721B1

(12) United States Patent
Nelson et al.

(10) Patent No.: US 6,224,721 B1
(45) Date of Patent: May 1, 2001

(54) ELECTROPLATING APPARATUS

(75) Inventors: Glenn M. Nelson; Tadeusz Maslach, both of Minneapolis, MN (US)

(73) Assignee: Nelson Solid Temp, Inc., Minneapolis, MN (US)

( * ) Notice: Subject to any disclaimer, the term of this patent is extended or adjusted under 35 U.S.C. 154(b) by 0 days.

(21) Appl. No.: 09/452,112

(22) Filed: Nov. 30, 1999

(51) Int. Cl.[7] .................................................. C25B 9/04
(52) U.S. Cl. .................... 204/272; 204/230.5; 204/230.8
(58) Field of Search ............................. 204/224 R, 230.5, 204/230.8, 272

(56) References Cited

U.S. PATENT DOCUMENTS

| 488,708 | 12/1892 | Craney . | |
|---|---|---|---|
| 3,065,153 | 11/1962 | Hough et al. | 204/26 |
| 3,470,082 | 9/1969 | Raymond et al. | 204/228 |
| 3,880,725 | 4/1975 | Van Raalte et al. | 204/15 |
| 4,294,670 | 10/1981 | Raymond | 204/26 |
| 4,461,690 | 7/1984 | Rolff et al. | 204/228 |
| 4,490,230 | 12/1984 | Fletcher | 204/228 |
| 4,828,654 | 5/1989 | Reed | 204/23 |
| 4,871,435 | 10/1989 | Denofrio | 204/224 |
| 4,933,061 | * 6/1990 | Kulkarni et al. | 204/224 R |
| 4,964,964 | 10/1990 | Murphy | 204/224 |
| 5,024,732 | 6/1991 | Hübel | 204/1.11 |
| 5,049,246 | 9/1991 | Hull et al. | 204/43.1 |
| 5,156,730 | 10/1992 | Bhatt et al. | 205/118 |
| 5,281,325 | 1/1994 | Berg | 205/125 |
| 5,439,567 | * 8/1995 | Cook | 204/272 |
| 5,441,619 | * 8/1995 | Kawachi et al. | 204/224 R |
| 5,558,757 | 9/1996 | Hübel | 205/96 |
| 5,788,829 | 8/1998 | Joshi et al. | 205/96 |

* cited by examiner

Primary Examiner—Bruce F. Bell
(74) Attorney, Agent, or Firm—Fredrikson & Byron, P.A.

(57) ABSTRACT

An electroplating apparatus including an elongated, hollow conductive anode tube having first and second ends, an inner conductive surface, and an outer conductive surface from which sacrificial plating metal may be suspended. An elongated cathode conductor is disposed within the hollow conductive anode tube, the cathode conductor having first and second ends, corresponding to the first and second ends of the anode tube, and an outer conductive surface. An insulation layer is placed between the outer surface of the cathode conductor and the inner surface of the anode tube. Power and ground cables respectively connect a power supply to the first end of the anode tube and the first end of the cathode conductor, and a conductive jumper connects the second end of the cathode conductor to an elongated cathode bar, from which articles to be plated may be suspended. By placing the cathode conductor within the anode tube, the far end of the cathode can be connected to the power supply without the need to string cables for the length of the plating tank, and the co-axial relationship of the cathode conductor within the anode tube reduces inductance within the system over this portion of the electrical distribution system.

9 Claims, 5 Drawing Sheets

ELECTROPLATING APPARATUS

TECHNICAL FIELD

The invention relates to an electroplating apparatus and, in particular, to an electroplating apparatus having a particular configuration of its anode and cathode.

BACKGROUND OF THE INVENTION

One important step in the manufacture of printed circuit boards is the plating of conductive material (typically, e.g., copper) onto a substrate to provide the desired circuit paths for the board. Usually the circuit board substrate will include holes extending through the thickness of the board. When plated, the holes connect the traces on one side of the board to traces on the other side of the board.

As electronic components get smaller, and the circuit traces on circuit boards get thinner (so as to provide more circuit density on a board), it becomes desirable to make the diameter of holes also proportionately smaller. As the size of the holes decrease, however, difficulties arise in obtaining the desired thickness of the copper plating within the hole. That is, the thickness of the copper deposited inside the holes tends to decrease (in comparison to the thickness deposited on adjacent circuit traces on the surface of the circuit board) as the hole diameter decreases.

This problem is fairly well-known, and one solution that is commonly employed to improve plating results is employing reverse pulsed DC power. In this technique, a DC current of, e.g., a few volts and about 300 amps is applied in the forward direction for, e.g., a few milliseconds, and then is reversed, typically at a higher amperage (e.g., about 900 amps) for a shorter time (e.g., a few microseconds). This pulsing has the effect of increasing the amount of material plated within the holes. With such rapid pulsing, however, inductance in the system prevents the actual waveform from being as square as would be desirable. That is, once current reversal is initiated, it takes some time to build the reverse current—this time is effectively wasted, and becomes a limiting factor on the frequency at which polarity reversal can be accomplished (higher frequencies being more effective and, therefore, desired). Thus, it is desirable to reduce the inductance in the overall system.

There are practical physical limitations on the configuration of plating systems, however. For example, in many plating line installations, the power supplies are mounted at one end of the plating tanks. Manufacturers prefer to have both ends of the anodes and cathodes supplied with current in an attempt to ensure even electrical distribution. This creates a problem in that one end of the anode may be, e.g., five feet from the power supply while the other end may be twenty feet away. The runs of cable to each end must be of the same length, however; if one were shorter than the other, it would have less resistance (a significant issue when working voltage is only a few volts), producing an uneven distribution of voltage on the anode and cathode and potentially overheating the shorter cable. The typical solution to this problem is to make both cables of the same length and simply coil the excess length of the cable that connects to the near end of the tank. Such lengths of cable, however, increase the inductance of the system, and therefore reduce the effectiveness of the reverse pulse technique.

SUMMARY OF THE INVENTION

The invention provides an electroplating apparatus that eliminates the excess lengths of cables and reduces the overall impedance of the plating system, substantially improving the plating performance of the system. The apparatus includes an elongated, hollow conductive anode tube having first and second ends, an inner conductive surface, and an outer conductive surface from which sacrificial plating metal may be suspended. An elongated cathode conductor is disposed within the hollow conductive anode tube, the cathode conductor having first and second ends, corresponding to the first and second ends of the anode tube, and an outer conductive surface. An insulation layer is placed between the outer surface of the cathode conductor and the inner surface of the anode tube. Positive and negative cables respectively connect the power supply to the first end of the anode tube and the first end of the cathode conductor, and a conductive jumper connects the second end of the cathode conductor to an elongated cathode bar, from which articles to be plated may be suspended.

By placing the cathode conductor within the anode tube, the far end of the cathode can be connected to the power supply without the need to string cables for the length of the plating tank, and the co-axial relationship of the cathode conductor within the anode tube reduces inductance within the system over this portion of the electrical distribution system.

DETAILED DESCRIPTION OF THE INVENTION

Figure 1:
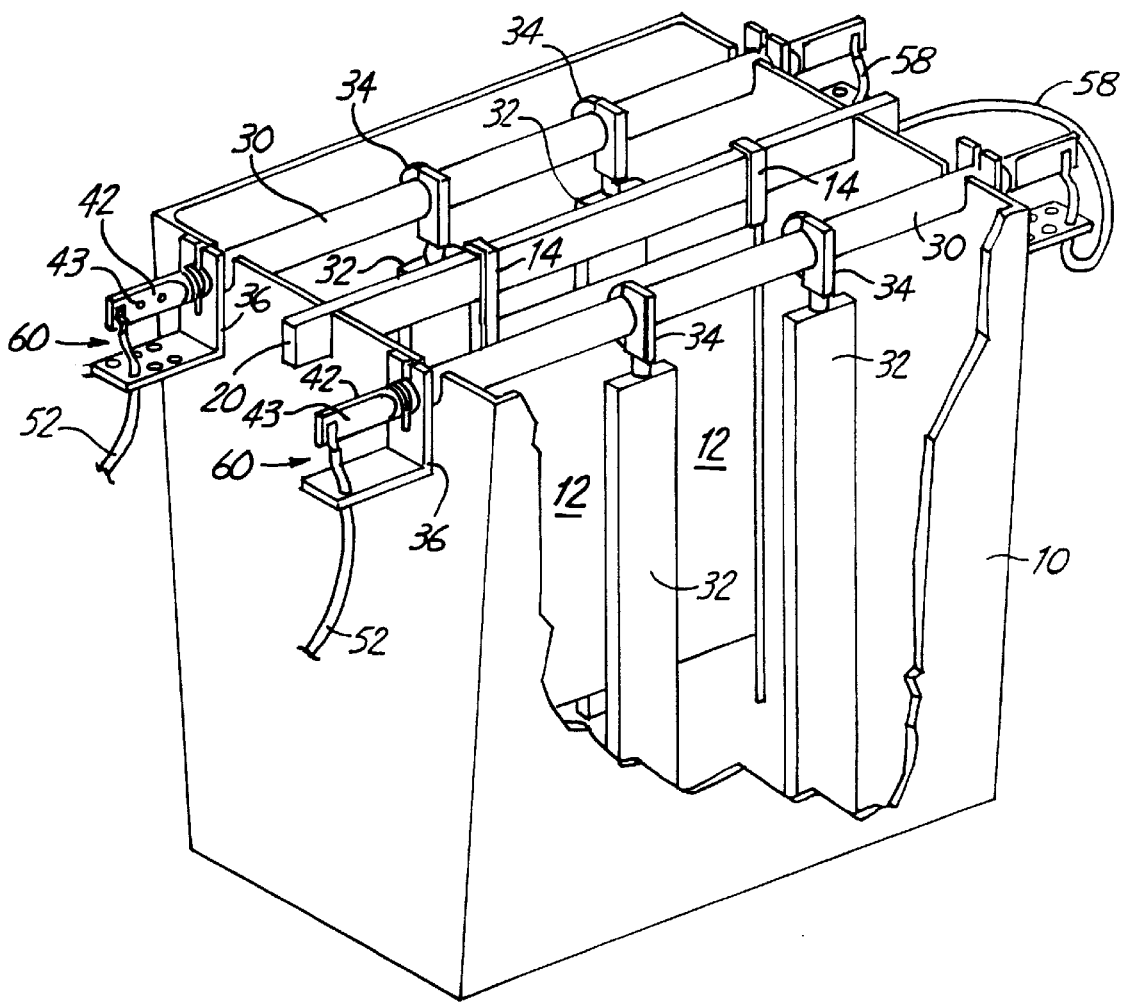
FIG. 1 is a perspective, partially broken-away view of an electroplating tank utilizing the electroplating apparatus of the invention.

FIG. 1 depicts an electroplating tank 10 fitted with the electroplating apparatus of the invention. The tank depicted is not necessarily to scale (most tanks used to plate circuit boards are longer—often ten to twelve feet long), but it illustrates the concepts employed. It should also be understood that, though the discussion of the invention is made with reference to plating circuit boards in relatively large tanks, the techniques and apparatus of the invention have equal applicability to many other electroplating applications involving tanks of various sizes.

During use, the tank 10, usually made from a non-conductive plastic, is filled with an electroplating solution (e.g., an acid copper bath). An elongated cathode bar 20 (made, e.g., from solid copper) is mounted generally in the center of the tank 10, extending from one end of the tank to the other. A circuit board 12 to be plated is suspended by electrically conductive hangers 14 from the cathode bar. In the drawing, a single circuit board 12 is depicted. In practice, most electroplating tanks simultaneously accommodate a number of circuit boards 12 (or other items to be plated) along the length of the cathode bar 20.

The cathode bar 20 is flanked by a pair of elongated conductive anode tubes 30, which also extend from one end of the tank to the other. Sacrificial metal plates 32 (made from the metal to be plated—in the case of circuit boards, typically copper) are suspended from the anode tubes 30 by electrically conductive clamps 34. Other suitable techniques for providing sacrificial metal may also be employed, such as providing sacrificial metal balls carried in electrically conductive baskets (made, e.g., from titanium) suspended from the anode tubes 30. Such techniques are well known in the art and need not be described in detail. In situations where only one side of an article is to be plated, a single anode tube 30 could be utilized; when both sides of an article are to be plated, as is usually the case with circuit boards, it is preferable to place anodes and sacrificial metal on both sides of the article being plated.

Figure 2:
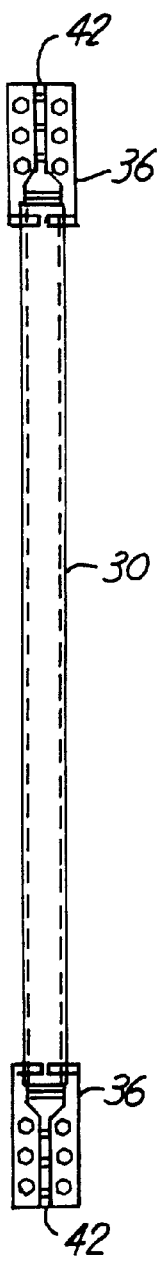
FIG. 2 is a plan view of an anode/cathode conductor utilized in the apparatus of the invention.
Figure 3:
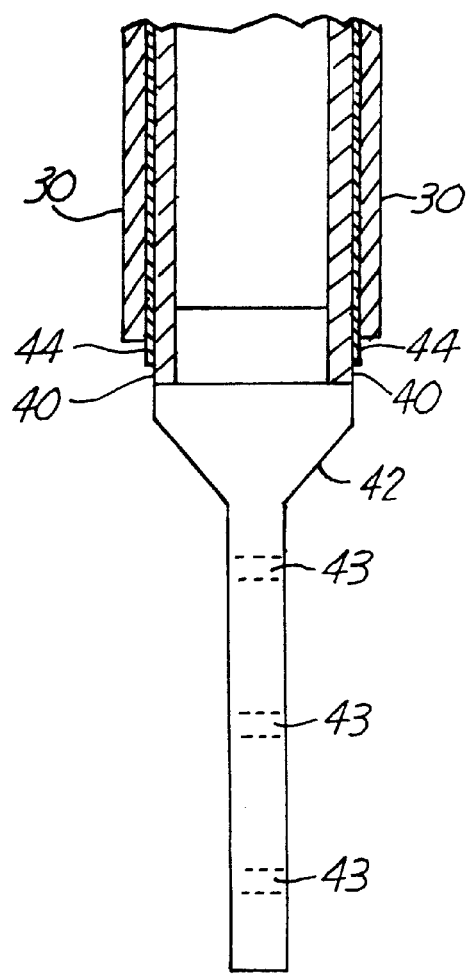
FIG. 3 is a broken-away view of one end of the anode/cathode conductor depicted in FIG. 2.

Referring now to FIGS. 1–3 each elongated conductive anode tube 30 is hollow. An elongated cathode conductor 40 is disposed within the anode tube 30. Preferably the cathode conductor 40 is also a hollow metal tube (though a solid metal bar could be used) having an outer conductive surface and an electrical connector 42 on each end (described in more detail below). The anode tube 30 and the cathode conductor 40 preferably are made from copper or other suitable conductors.

The sizes of the cathode conductor 40 and the anode tube 30 may vary significantly depending upon the application in which they are used. For large commercial circuit board plating tanks (which can be, e.g., in the range of fourteen feet across) desirably the cathode conductor 40 has an outer diameter of at least about an inch, and preferably a diameter of at least about an inch and a half, with a wall thickness of desirably at least about 0.1 inches and preferably at least about 0.15 inches. The ampacity of the anode tube 30 and the cathode conductor 40 preferably are similar, each being sufficiently large to exceed the current draw of the system. The inner diameter of the anode tube 30 thus corresponds to the outer diameter of the cathode conductor 40, and preferably the inner surface of the anode tube 30 is positioned as close to the outer surface of the cathode conductor 40 as reasonably possible (while allowing for an insulation layer between them). In the above configuration where the cathode tube 40 has an outer diameter of at least about one inch, preferably the anode tube 30 has an outer diameter of at least about an inch and a half In one preferred configuration of the system of the invention, an anode tube 30 about 12.5 feet long has an outer diameter of 2.375 inches, and a wall thickness of 0.22 inches, while the cathode conductor 40 has an outer diameter of 1.95 inches and a wall thickness of 0.22 inches.

As indicated above, however, it should be understood that the dimensions of these components may be adapted to systems of other sizes, with the diameters and thicknesses of the anode tube 30 and the cathode conductor 40 being dictated by the required current carrying capacity of these components in relation to their required length for use on the plating tank being utilized. Also, though the preferred cross-sectional shape of the anode tube 30 and cathode conductor is circular, other shapes may also be employed if desired.

An insulation layer 44 is disposed between the outer surface of the cathode conductor 40 and the inner surface of the anode tube 30. The insulation may be of any suitable type, and preferably is sufficiently thick to effectively electrically insulate the cathode conductor 40 from the anode tube 30 for up to, e.g., 250 volts (depending on the voltages used for plating—lesser insulation may be sufficient in many low voltage plating techniques). A double layer of 3M brand insulating tape wound around the cathode conductor 40 has worked well. Other suitable insulating coatings could also be utilized, such as fiberglass motor winding tape painted with insulating epoxy resin.

Figure 4:
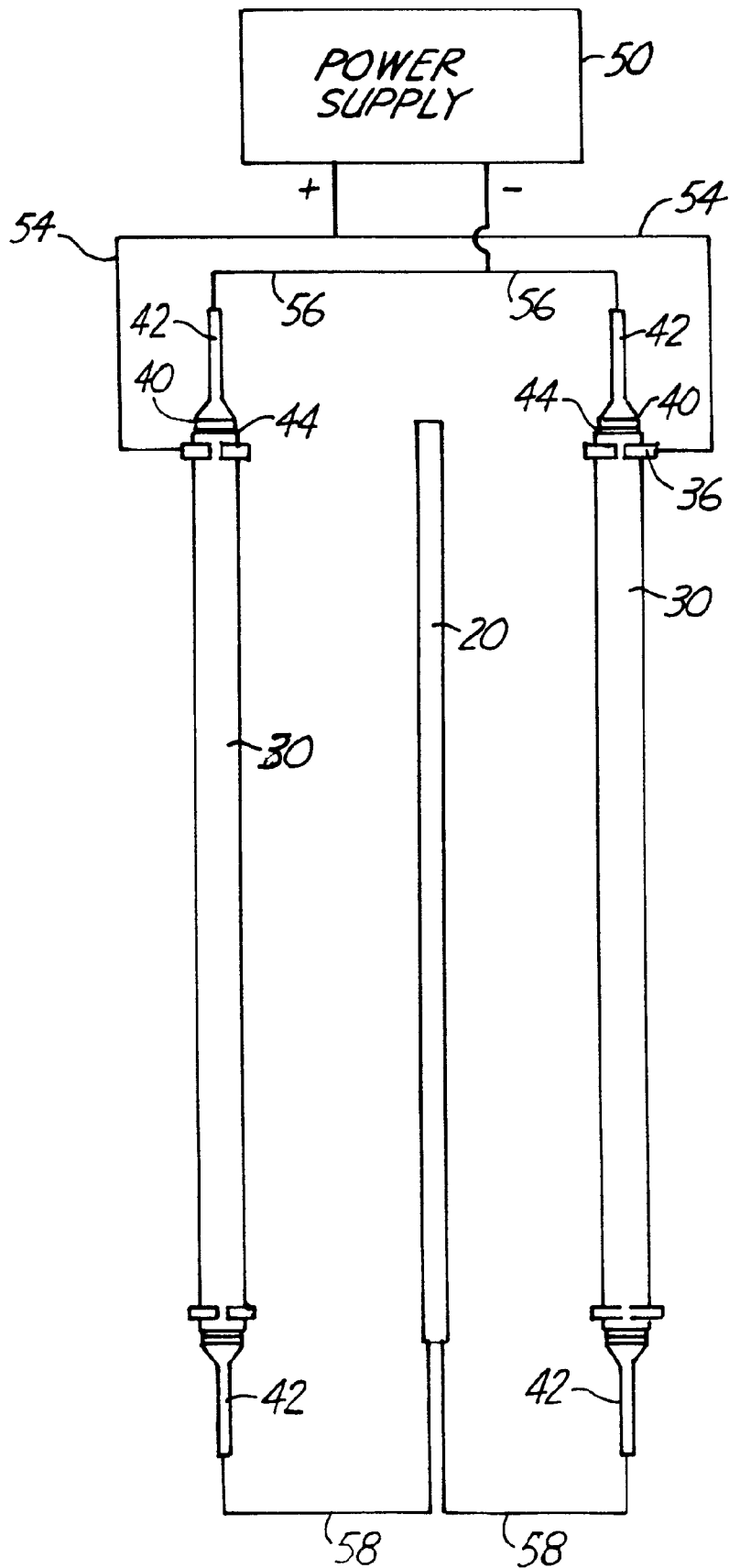
FIG. 4 is a somewhat schematic view of the electroplating apparatus of the invention.

The coaxial arrangement of the anode tube 30 and the cathode conductor 40 provides a low inductance technique for connecting a power supply 50 to the far end of the cathode 20 without the need to string long cables to the far end of the tank 10. FIG. 4 depicts one arrangement for such electrical connections. A single power supply 50 has an anode output (+) connected to a first end of each of the anode tubes 30 by conductor 54 (which is secured to the anode tube 30 by a clamp 36). The power supply 50 also has a cathode output (−) connected by a similar conductor 56 to the connectors 42 on the first end of the cathode conductor 40. Jumpers 58 connect the far end of the cathode conductor 40 to the cathode bar 20. By constructing the anode tubes 30 and cathode conductors 40 with excess electrical capacity and connecting them in the opposite, balanced configuration shown in the drawings, it is not necessary to connect both ends of the anode tubes 30 to the power supply (in the opposite, balanced configuration, the power supply 50 is connected to one end of the anode tube 30, and to the opposite end of the cathode bar 20, so that any slight voltage drop along the length of the anode tube 30 is balanced by an opposing slight voltage drop along the length of the cathode bar 20—thus all articles to be plated are subjected to essentially the same plating voltage regardless of their position on the cathode bar 20).

Figure 5:
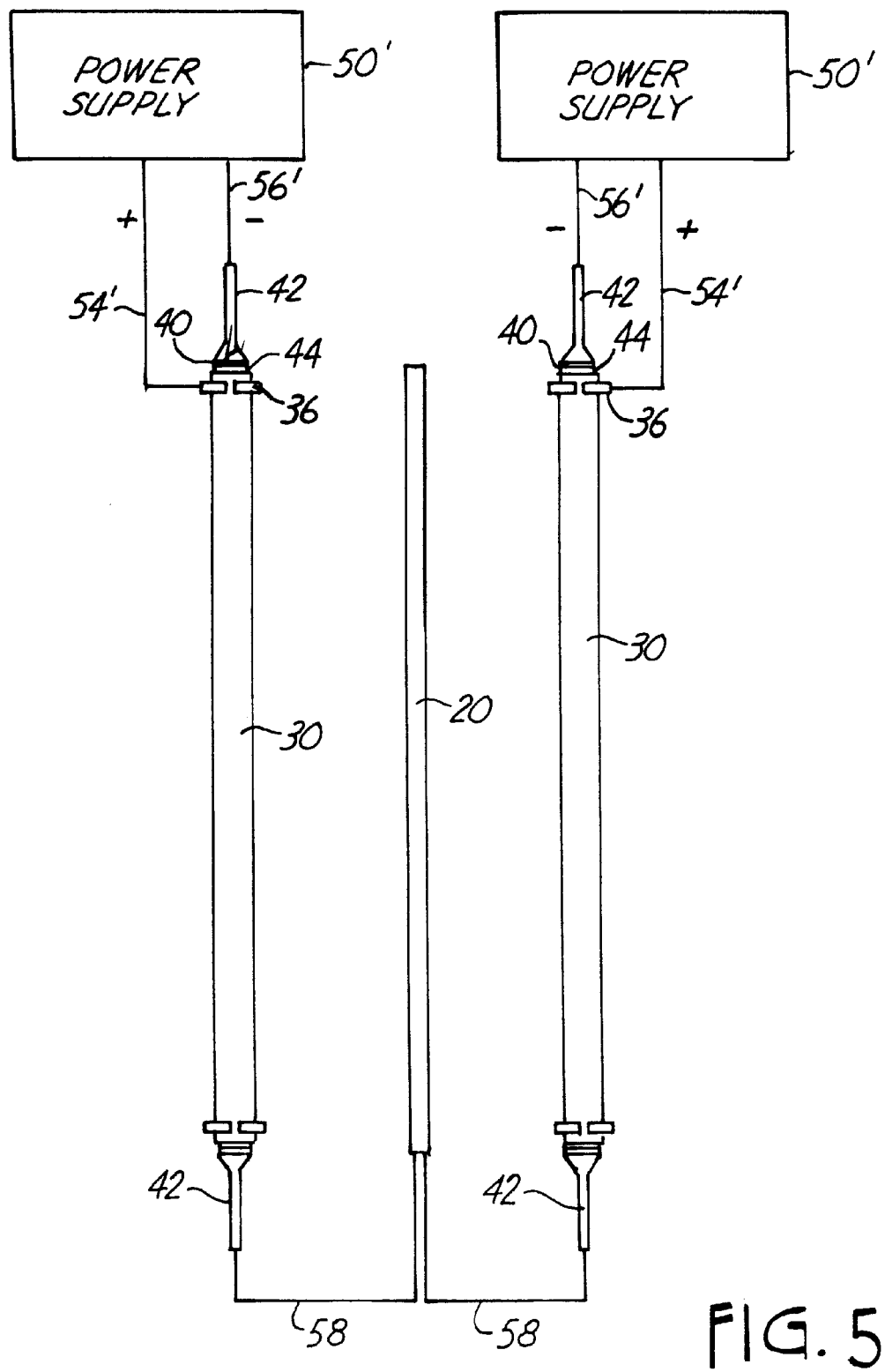
FIG. 5 is a somewhat schematic view of a slightly modified embodiment of the electroplating apparatus of the invention.

FIG. 5 depicts an alternate configuration. In this arrangement two identical power supplies 50' are utilized, each one being connected to one of the anode tubes 30 (through conductor 54') and its associated cathode conductor 40 (through conductor 56'), both power supplies thus being connected to the cathode bar 20.

Figure 6:
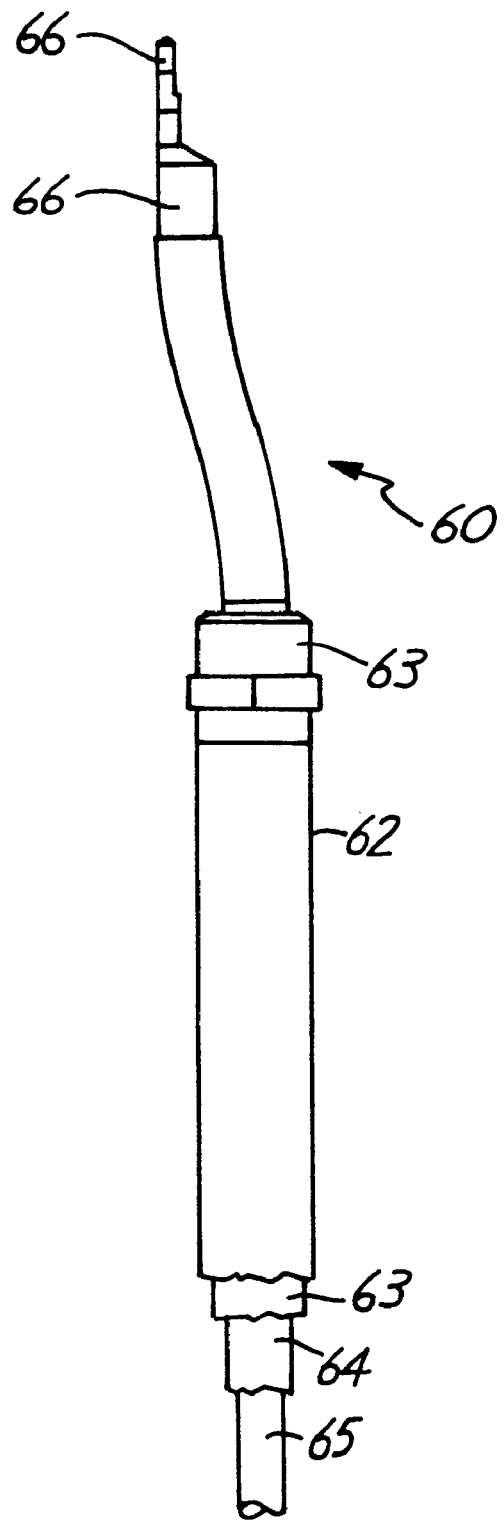
FIG. 6 is a broken-away view of a cable connector used in the electroplating apparatus of the invention

FIG. 6 depicts a preferred connector 60 for connecting a coaxial power supply cable 52 to the anode tube clamp 36 and the cathode conductor connector 42. The coaxial cable includes an outer insulating layer 62 covering an outer conductive layer 63, and an inner insulating layer 64 covering an inner conductor 65. The outer conductive layer 63 thus can be connected to the clamp 36 while the inner conductor 65 terminates in an eyelet 66 that can be bolted to holes 43 in the connector 42 on the end of the cathode conductor 40. The jumpers 58 that connect the far end of the cathode conductor 40 to the cathode bar 20 consist of a single conductor terminating in an eyelet on each end, the eyelets being secured by suitable bolts respectively to the connector 42 and to tapped holes in the end cathode bar 20.

While a preferred embodiment of the present invention has been described, it should be understood that various changes, adaptations and modifications may be made therein without departing from the spirit of the invention and the scope of the appended claims.

What is claimed is:

1. An electroplating apparatus, comprising:
    an elongated, hollow conductive anode tube having first and second ends, an inner conductive surface, and an outer conductive surface from which sacrificial plating metal may be suspended;
    an elongated cathode conductor disposed within the hollow conductive anode tube, the cathode conductor having first and second ends, corresponding to the first and second ends of the anode tube, and an outer conductive surface;
    an insulation layer disposed between the outer surface of the cathode conductor and the inner surface of the anode tube;

a power supply;

power and ground cables respectively connecting the power supply to the first end of the anode tube and the first end of the cathode conductor;

an elongated cathode bar having an outer conductive surface from which articles to be plated may be suspended; and a conductive jumper connecting the second end of the cathode conductor to the cathode bar.

2. The electroplating apparatus of claim 1 further comprising a second hollow conductive anode tube having first and second ends, an inner conductive surface, and an outer conductive surface from which sacrificial plating metal may be suspended;

a second elongated cathode conductor disposed within the second hollow conductive anode tube, the second cathode conductor having first and second ends, corresponding to the first and second ends of the second anode tube, and an outer conductive surface;

an elongated insulation layer disposed between the outer surface of the second cathode conductor and the inner surface of the second anode tube;

power and ground cables respectively connecting the power supply to the first end of the second anode tube and the first end of the second cathode conductor; and a conductive jumper connecting the second end of the second cathode conductor to the cathode bar.

3. The electroplating apparatus of claim 1 further comprising a second hollow conductive anode tube having first and second ends, an inner conductive surface, and an outer conductive surface from which sacrificial plating metal may be suspended;

a second elongated cathode conductor disposed within the second hollow conductive anode tube, the second cathode conductor having first and second ends, corresponding to the first and second ends of the second anode tube, and an outer conductive surface;

an insulation layer disposed between the outer surface of the second cathode conductor and the inner surface of the second anode tube;

a second power supply;

power and ground cables respectively connecting the second power supply to the first end of the second anode tube and the first end of the second cathode conductor; and a conductive jumper connecting the second end of the second cathode conductor to the cathode bar.

4. The electroplating apparatus of claim 1 wherein the cathode conductor has an outer diameter of at least about one inch.

5. The electroplating apparatus of claim 1 wherein the cathode conductor is longer than the anode tube.

6. The electroplating apparatus of claim 1 wherein the insulation layer comprises a coating applied to the outer conductive surface of the cathode conductor.

7. The electroplating apparatus of claim 6 wherein the coating comprises insulating tape wound about the cathode conductor.

8. The electroplating apparatus of claim 1 wherein the anode tube has a circular cross-section.

9. An electroplating apparatus, comprising:

an electroplating tank having first and second ends;

an elongated, hollow conductive anode tube having first and second ends disposed, respectively, at the first and second ends of the electroplating tank, the anode tube having an inner conductive surface and an outer conductive surface from which sacrificial plating metal may be suspended;

an elongated cathode conductor disposed within the hollow conductive anode tube, the cathode conductor having first and second ends, corresponding to the first and second ends of the anode tube, and an outer conductive surface;

an elongated insulation layer disposed between the outer surface of the cathode conductor and the inner surface of the anode tube;

a power supply disposed at the first end of the electroplating tank;

power and ground cables respectively connecting the power supply to the first end of the anode tube and the first end of the cathode conductor;

an elongated cathode bar having first and second ends disposed, respectively, at the first and second ends of the electroplating tank, the cathode bar having an outer conductive surface from which articles to be plated may be suspended; and a conductive jumper connecting the second end of the cathode conductor to the second end of the cathode bar.

* * * * *